United States Patent
Kojima et al.

(10) Patent No.: US 6,423,242 B1
(45) Date of Patent: Jul. 23, 2002

(54) ETCHING METHOD

(75) Inventors: Masayuki Kojima, Kokubunji; Yoshifumi Tahara, Kitakoma-gun; Masayuki Tomoyasu, Nirasaki; Akira Koshiishi, Kofu, all of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/437,447

(22) Filed: Nov. 10, 1999

(30) Foreign Application Priority Data

Dec. 2, 1998 (JP) .......................................... 10-342764

(51) Int. Cl.$^7$ .......................... C03C 15/00; H01L 21/44
(52) U.S. Cl. .............................. 216/79; 216/71; 216/80; 438/723; 438/729; 438/743
(58) Field of Search ................................ 438/723, 729, 438/733, 743, 719; 216/67, 71, 79, 80

(56) References Cited

U.S. PATENT DOCUMENTS

| | | |
|---|---|---|
| 5,272,417 A | 12/1993 | Ohmi |
| 5,656,123 A | 8/1997 | Salimian et al. |
| 5,707,486 A | 1/1998 | Collins |
| 5,976,766 A | * 11/1999 | Kasuga et al. .............. 430/313 |

OTHER PUBLICATIONS

Akira Koshiishi, et al. "Effect of Increasing the Upper Frequency on Dual Frequency Capacitive–Coupled–Plasma," Proceedings of Symposium on Dry Process, The Institute of Electrical Engineers of Japan, Nov. 11–13, 1998, pp. 229–234.

Youbun Itoh, et al. "Characterization of Highly Selective $SiO_2/Si_3N_4$ Etching Using $C_5F_8$," Proceedings of Symposium on Dry Process, The Institute of Electrical Engineers of Japan, Nov. 11–13, 1998, pp. 263–268.

* cited by examiner

Primary Examiner—Gregory Mills
Assistant Examiner—Luz Alejandro
(74) Attorney, Agent, or Firm—Oblon, Spivak, McClelland, Maier & Neustadt, P.C.

(57) ABSTRACT

When in a chamber, an upper electrode and a lower electrode (suscepter) are provided opposite to each other and with a to-be-treated substrate supported by the lower electrode, the high-frequency electric field is formed between the upper electrode and the lower electrode to generate plasma of the process gas while introducing the process gas into the chamber held to the reduced pressure, and an etching is provided to the to-be-treated substrate with this plasma, the high frequency in the range from 50 to 150 MHZ, for example, 60 MHz, is applied to the upper electrode, and the high frequency in the range from 1 to 4 MHz, for example, 2 MHz, is applied to the lower electrode.

5 Claims, 9 Drawing Sheets

ETCHING METHOD

BACKGROUND OF THE INVENTION

The present invention relates to a plasma treatment apparatus for applying plasma treatment to substrates such as semiconductor substrates as well as to an etching method using plasma.

For example, in a manufacturing process of semiconductor devices, plasma treatment, such as etching, sputtering, CVD (chemical vapor deposition) is popularly used for semiconductor wafers, to-be-treated substrates.

For plasma treatment apparatus to carry out this kind of plasma treatment, various types are available, and of them, the capacitive coupling type parallel flat plate plasma treatment apparatus is of the mainstream.

The capacitive coupling type parallel flat plate plasma treatment apparatus has a pair of parallel flat plate electrodes (upper and lower electrodes) arranged in the chamber, forms a high-frequency electric field between the electrodes by introducing process gas into the chamber and applying high frequency to one of the electrodes, and thus forms plasma of process gas by the high-frequency electric field to apply plasma treatment to the semiconductor wafer.

When a film on the semiconductor wafer, for example, an oxide film, is etched by the capacitive coupling type parallel flat plate plasma treatment apparatus, the optimum radical control is enabled by keeping the chamber inside to a medium pressure and forming a medium-density plasma, thereby attaining the optimum plasma condition as well as achieving etching of high stability and reproducibility at high selection ratio.

Specifically, it is disclosed in the 1997 Dry Process Symposium P385-390 that satisfactory etching is able to be achieved at 20 to 100 mTorr pressure by applying high frequency of 27.12 MHz for plasma forming to the upper electrode to form the plasma while applying high frequency of 800 kHz to the lower electrode to draw in ions generated by plasma.

However, in recent years, refinement of the design rule in USLI has still more increased and a still higher aspect ratio of the hole profile is required, and conventional conditions are not always able to satisfy oxide film etching, etc.

BRIEF SUMMARY OF THE INVENTION

It is an object of the present invention to provide a plasma treatment apparatus that can respond to the increased refinement and an etching method that can achieve etching satisfying requirements of increased refinement and with higher selectivity.

According to the first aspect of the present invention, there is provided a plasma treatment apparatus for generating plasma of a process gas by forming a high-frequency electric field between first and second electrodes while introducing the process gas into a chamber held to reduced pressure with the first and the second electrodes mounted opposite to each other inside the chamber and with the to-be-treated substrate supported by the second electrode, and applying a specified plasma treatment to the to-be-treated substrate with this plasma, in which the first high-frequency power supply with the frequency in the range from 50 to 150 MHz is connected to the first electrode, and the second high-frequency power supply with the frequency in the range from 1 to 4 MHz is connected to the second electrode.

According to the second aspect of the present invention, there is provided an etching method for etching an $SiO_2$ film formed on an SiN film on a substrate with plasma of process gas contains $C_4F_8$ which is formed by a high-frequency electric field applied between first and second electrodes while introducing the process gas into a chamber held to reduced pressure with the first and the second electrodes mounted opposite to each other inside the chamber and with the to-be-treated substrate supported by the second electrode, the improvement in which the high frequency in the range from 50 to 150 MHz is applied to the first electrode and a high frequency in the range from 1 to 4 MHz is applied to the second electrode.

In the present invention, when a high-frequency electric field is formed between the first and the second electrodes to generate plasma of the process gas while the process gas is being introduced into the chamber held to reduced pressure, and plasma treatment, particularly, etching treatment, is carried out on the to-be-treated substrate by the plasma with the first and the second electrodes mounted opposite to each other in the chamber and the to-be-treated substrate supported by the second electrode, high frequency of 50 to 150 MHz is applied to the first electrode and high frequency of 1 to 4 MHz is applied to the second electrode, both of which are higher than the conventional. Because by applying high frequency of 50 to 150 MHz to the first electrode, which is higher than the conventional, in this way, it is possible to increase the plasma density without changing the plasma dissociation condition from that of the conventional suitable plasma, and to form the suitable plasma in still lower pressure condition, it is possible to properly respond further advanced refinement of design rule. In addition, it is possible to exert suitable ion effects on the to-be-treated substrate at low pressure by applying high frequency of 1 to 4 MHz to the second electrode, which is higher than-the conventional, and particularly in the case of etching, anisotropic etching with still higher selectivity becomes possible, and at the same time, damage to the to-be-treated substrate decreases. In-addition, it is also possible to achieve plasma treatment, particularly, etching treatment, with a wide margin of process conditions and extremely high stability by adopting the conditions of the present invention.

In this case, it is desirable that the high frequency applied to the first electrode ranges from 50 to 80 MHz and the high frequency applied to the second electrode ranges from 1 to 3 MHz. Typically, the high frequency applied to the first electrode is about 60 MHz and the high frequency applied to the second electrode is about 2 MHz. When etching is carried out in this way, it is desirable to keep the chamber inner pressure at 1.06 to 13.3 Pa.

The etching method according to the present invention is effective when the to-be-treated substrate has an SiN film and an $SiO_2$ film thereon and an etched layer is $SiO_2$ film, and for the process gas in such a case, that containing $C_5F_8$ and $O_2$ is suitable. In this case, noble gas such as Ar or He, or $N_2$ may be added in addition to $C_5F_8$ and $O_2$. Or, other fluorocarbon gas ($C_xF_y$) such as $CF_4$, $C_4F_8$ or hydrofluorocarbon gas ($C_pH_qF_r$) such as $CHF_3$, $CH_2F_2$ may be added. The partial pressure of $C_5F_8$ is preferably between 0.5 mTorr and 2 mTorr. In addition, in the process gas containing $C_5F_8$ and $O_2$, the flow ratio $O_2/C_5F_8$ of $C_5F_8$ to $O_2$ is preferable to be in the range of $5/8 \leq O_2/C5F8 \leq 7/8$.

Similarly, when the to-be-treated substrate has the SiN film and $SiO_2$ film thereon and the etched layer is the $SiO_2$ film, the process gas containing $C_4F_8$ is also suitable. In such case, noble gas such as Ar, He or $N_2$ may be added in addition to $C_4F_8$. Or, in the similar manner, other fluorocarbon gas or hydrofluorocarbon gas may be added. Since satisfactory etching characteristics are able to be obtained at the pressure inside the chamber as low as 1.06 to 2.00 Pa when the gas containing $C_4F_8$ is used for the process gas, it is desirable to carry out etching at such low pressure. In addition, when a hole is formed in the $SiO_2$ film by etching in this way, properly controlling the conditions enables etching at a high etch rate even when the hole diameter is as fine as 0.1 to 0.4 μm. In particular, 0.15 to 0.4 μm is desirable.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given, below, serve to explain the principles of the invention.

DETAILED DESCRIPTION OF THE INVENTION

Figure 1:
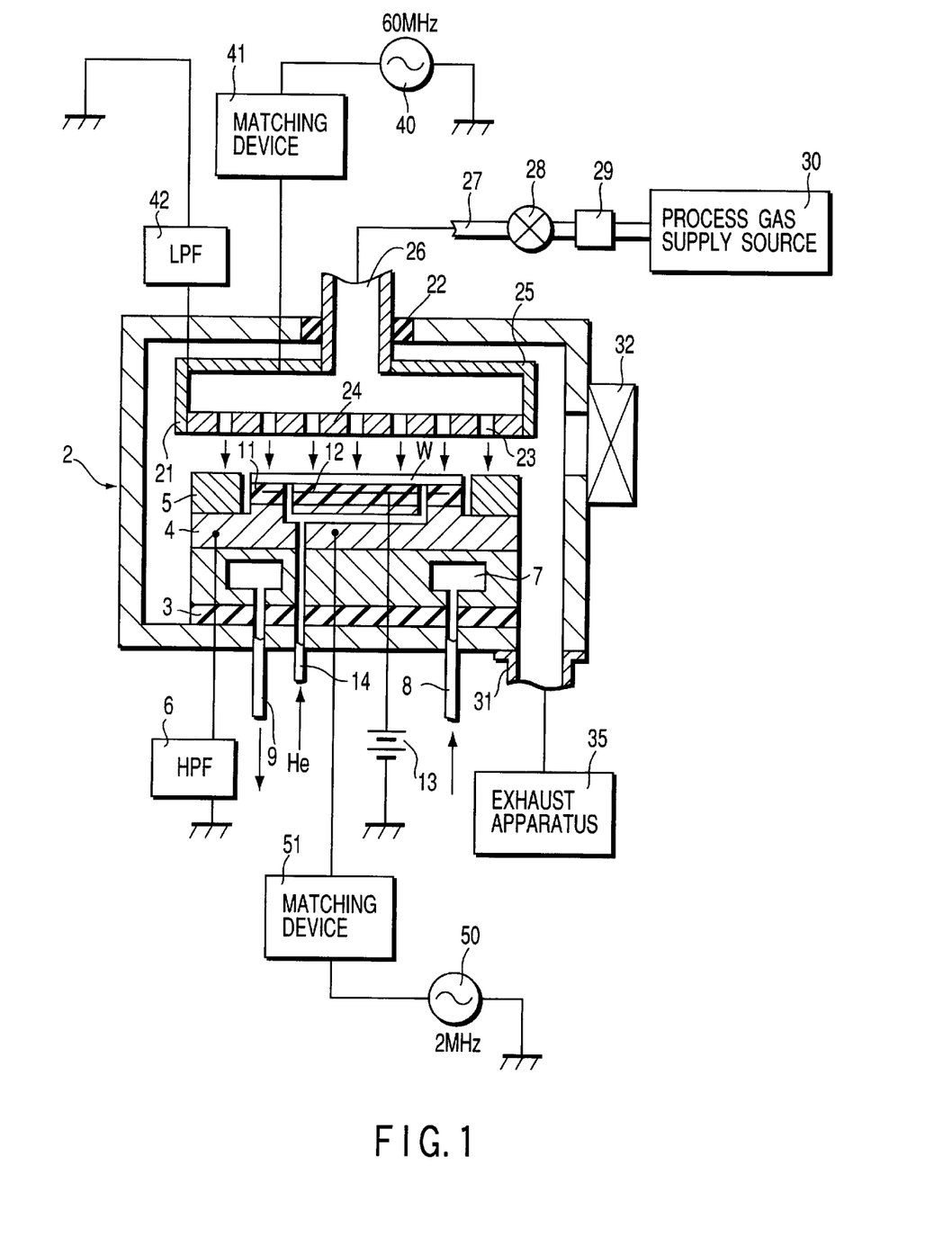
FIG. 1 is a cross-sectional view showing the etching apparatus according to one embodiment of the present invention.

Referring now to attached drawings, the embodiment of the present invention will be described in detail. FIG. 1 is a cross-sectional view schematically showing the plasma treatment apparatus according to one embodiment of the present invention. The plasma treatment apparatus 1 is configured as a capacitive coupling type parallel flat plate etching apparatus with electrode plates oppositely in parallel vertically and a plasma forming power supply connected to one of the plates.

The etching treatment apparatus 1 has a chamber 2 formed in the cylindrical shape made of aluminum whose inner surface is alumite-treated (anodizing), and this chamber 2 is grounded for protecting the device. To the bottom portion inside the chamber 2, a nearly columnar-form suscepter supporter 4 for mounting a to-be-treated object, for example, semiconductor wafer W (hereinafter called the "wafer") is provided via an insulation plate 3 such as ceramics, and in addition, on the susceper supporter 4, a susceper 5 constituting a lower electrode is provided. The susceper 5 is electrically connected to a high-pass filter (HPF) 6 which is grounded.

Inside the susceper supporter 4, a circular refrigerant chamber 7 is provided, into which for example, a refrigerant such as liquid nitrogen is introduced via a refrigerant injection tube 8 to circulate, and the cold heat is transferred to the wafer W via the susceper 5, and the treated surface or upper surface of the wafer W is controlled to the desired temperature.

The susceper 5 is formed in a disk shape with the center portion protruded, and on the susceper, an electrostatic chuck 11 of a profile nearly same as that of the wafer W is provided. The electrostatic chuck 11 has an electrode 12 intervened between insulation films. By applying, for example, 1.5 kV dc voltage from a dc power supply 13 connected to the electrode 12, the wafer W is electrostatically absorbed onto the chuck by, for example, the Coulomb's force.

Through the insulation plate 3, susceper supporter 4, susceper 5, and the electrostatic chuck 11, a gas passage 14 is formed. The passage 14 feeds a heat-transfer medium, such as He gas, to the rear surface of the wafer W which is the to-be-treated object on the chuck. A cold heat of the susceper 5 is transferred to the wafer W via this heat transferring medium and thus the wafer W is maintained to a specified temperature.

On the top end peripheral portion of the susceper 5, an annular-form focus ring 15 is arranged in such a manner to surround the wafer W mounted on the electrostatic chuck 11. The focus ring 15 is made of electro-conductive materials such as silicon, thereby improving the uniformity of etching.

Above the susceper 5, an upper electrode 21 is provided oppositely in parallel to the susceper 5. The upper electrode 21 is supported to the upper wall of the chamber 2 via an insulator 22, forms a surface opposite to the susceper 5. The upper electrode 21 comprises an electrode plate 24 with a large number of discharge holes 23 made from, for example, silicon, SiC, or amorphous carbon, and an electrically cylindrical conductive member 25 for supporting the flat electrode 24, for example an electrode supporter made of aluminum whose surface is alumite-treated. The susceper 5 and the upper electrode 21 are kept, for example, about 10 to 60 mm away from each other. For the electrode plate 24, silicon which is able to be scavenged is suitably used of the above-mentioned materials.

Above the center of the electrode supporter 25 of the upper electrode 21, a gas introducing port 26 is provided, to which a gas supply tube 27 is connected. This gas supply tube 27 is connected to a process gas supply source 30 via a valve 28 and a mass flow controller 29. From the process gas supply source 30, a process gas for plasma treatment, for example, etching, is supplied.

For the process gas, various gases used conventionally are able to be adopted, and the gas containing halogen element such as fluorocarbon gas ($C_xF_y$) is able to be suitably used. When the wafer W has an SiN film and an $SiO_2$ film thereon and the $SiO_2$ film is to be etched, the gas containing $C_4F_8$ or $C_5F_8$ is suitable for the process gas. When $C_5F_8$ is used, it is desirable to add $O_2$, and in such a case, the partial pressure of $C_5F_8$ should be desirably 0.5 to 2 mTorr and the ratio should be desirably in the range of $5/8 \leq O_2/C_5F_8 \leq 7/8$, Even when the gas containing $C_4F_8$ is used for the process gas, or even when the gas containing $S_5F_8$ and $O_2$ is used, Ar, He, or other noble gas or $N_2$ may be added, and furthermore, other fluorocarbon gases ($C_xF_y$) or hydrofluorocarbon gas ($C_pH_qF_r$) may be added.

To a port formed in the bottom wall of the chamber 2, an exhaust tube 31 is connected, and to the exhaust tube 31, an exhaust apparatus 35 is connected. The exhaust apparatus 35 comprises a vacuum pump, such as turbo-molecular pump. The inside of the chamber 2 is able to be evacuated to the specified reduced pressure atmosphere, for example, to the specified pressure of 1 Pa or lower, by the vacuum pump through the exhaust tube. On the side wall of the chamber 2, a gate valve 32 is provided. When the gate valve 32 opens, the wafer W is transferred through the gate valve from or to an adjacent load lock chamber (not illustrated).

To the upper electrode 21, a first high-frequency power supply 40 is connected through a matching device 41. To the upper electrode 21, a low-pass filter (LPF) 42 is connected. The first high-frequency power supply 40 supplies a power of a high frequency in the range of 50 to 150 MHz to the upper electrode, so that a high-density plasma with desirable separation condition is formed in the chamber 2, enabling plasma treatment under the pressure conditions lower than the conventional. For the frequency of this first high-frequency power supply 40, 50 to 80 MHz is preferable, and typically, 60 MHz illustrated or the conditions in the vicinity may be adopted.

To the susceptor 5 for the lower electrode, a second high-frequency power supply 50 is connected through a matching device 51. The second high-frequency power supply 50 supplies a power of a frequency in the range of 1 to 4 MHz, and by applying the frequency of this range, it is possible to give proper ion effects without damaging the wafer W which is the to-be-treated object. For the frequency of the second high-frequency power supply 50, the range from 1 to 3 MHz is preferable, and typically, 2 MHz illustrated or the conditions in the vicinity are adopted.

Next description will be made on the case in which the oxide film formed on the wafer W is etched in the plasma treatment apparatus constructed as described above. First of all, the wafer W which is the to-be-treated object, is carried from the load lock chamber not illustrated into the chamber 2 after the gate valve 32 is opened and placed on the electrostatic chuck 11. The dc voltage is applies to the electrode 12 from the high-voltage dc power supply 13, so that the wafer W is electrostatically absorbed onto the electrostatic chuck 11 and thus supported thereon. Then, the gate valve 32 is closed, and the inside of the chamber 2 is evacuated to the specified vacuum level by the exhaust mechanism 35.

Then, the valve 28 is opened, and the process gas from the process gas supply source 30, for example, $C_4F_8$ gas and Ar gas for diluting gas are introduced to the hollow portion of the upper electrode 21 through the process gas supply pipe 27 and gas introducing port 26 while the flow rate is being adjusted by the mass flow controller 29, and are uniformly discharged toward the wafer W as shown in the arrow mark in FIG. 1 through the discharge holes 23 of the electrode plate 24.

The pressure inside the chamber 2 is maintained to a specified pressure. The pressure in this case is preferably between 1.06 and 13.3 Pa. Thereafter, the high frequency between 50 and 150 MHz, for example, 60 MHz is applied to the upper electrode 21 from the first high-frequency power supply 40. With this, the high-frequency electric field is generated between the upper electrode 21 and the susceptor 5 as the lower electrode, and the process gas, for example, $C_4F_8$ gas is dissociated to be made into plasma.

On the other hand, from the second high-frequency power supply 50, the high frequency between 1 and 4 MHz, for example, 2 MHz, is applied to the susceptor 5 as the lower electrode. With this, ions in the plasma are drawn onto the susceptor 5 side, and the anisotropy of etching is further enhanced by ion assist.

By bringing the high frequency applied to the upper electrode 21 higher than conventional 27 MHz in this way, the plasma density can be increased without changing the dissociation condition of the plasma from that of the conventional plasma, and it becomes possible to form suitable plasma under still lower vacuum conditions, making it possible to properly respond to further refinement of the design rule. In addition, by applying the frequency higher than conventional 800 kHz to the susceptor 5 which is the lower electrode, as described above, it is possible to exert proper ion effects to the to-be-treated substrate at still lower pressure, and anisotropic etching with still higher selectivity is enabled, and in addition, damage to the to-be-treated substrate is decreased. Since this kind of proper plasma condition is able to be formed under the vacuum conditions and simultaneously, proper ion effects are able to be exerted, applying the high frequency in the above-mentioned range to the upper electrode 21 and the susceptor 5 enables the etching treatment with a wider margin of process conditions and with remarkably high stability.

For the wafer W with the SiN film formed on the silicon substrate or wafer and the $SiO_2$ film formed on the SiN film, description will be made on the embodiment in which $SiO_2$ film etching is carried out by applying the present invention by using the gas containing $C_5F_{8B}$ and $O_2$ as process gas.

Figure 2A:
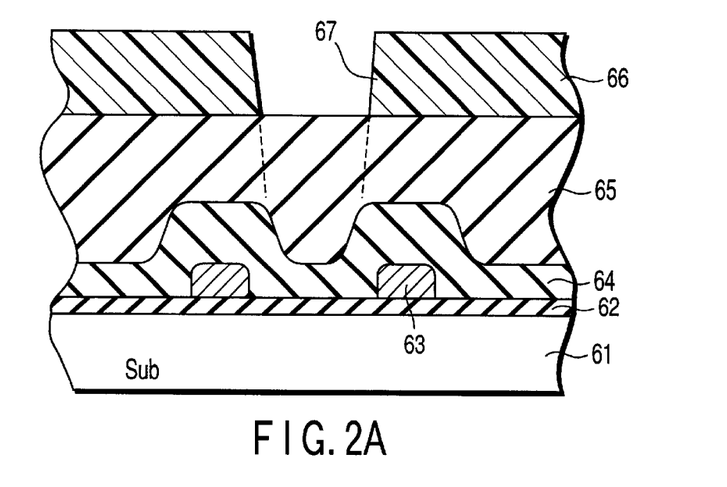
FIGS. 2A to 2C are schematic views showing how to find the sample structure used when the etching experiment is carried out by using $C_5F_8$ and $O_2$ for process gas and to find the etching rate of the SiN film in such a case.

In this case, a hole is formed under the construction as shown in FIG. 2A. Reference numeral 61 in the figure denotes a silicon substrate, on which a gate 63 is formed via a gate oxide film ($SiO_2$) 62. An SiN film 64 is formed by covering the gate oxide film 62 and the gate 63, on which an $SiO_2$ film 65 is formed. Then, with a resist layer 66 used as a mask, a hole is formed at the portion corresponding to an opening portion 67 of the $SiO_2$ film 65.

Figure 2B:
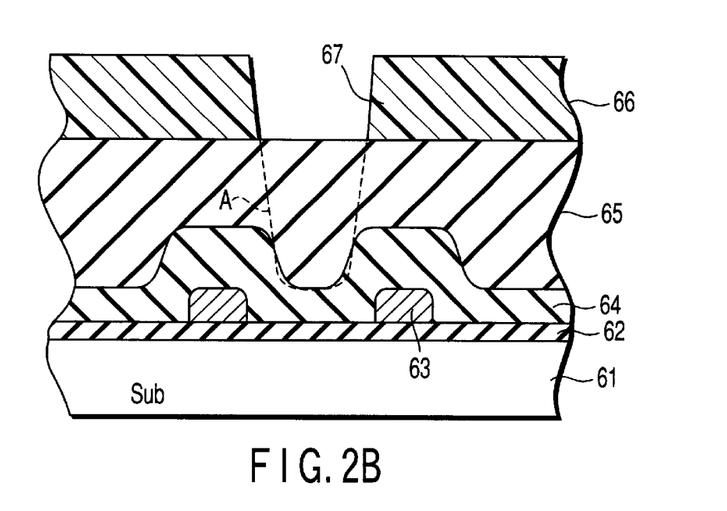
Figure 2C:
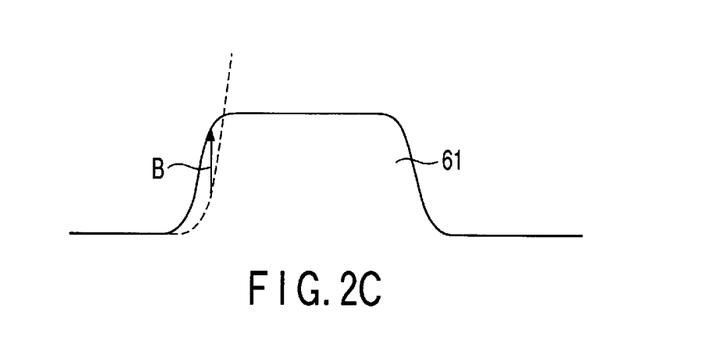

In such a case, etching is carried out in which for the high frequency applied to the upper electrode 21 and the susceptor 5, 60 MHz and 2 MHz are used, respectively, for the embodiment, and 27 MHz and 800 kHz, respectively, for the comparison, and 1000 W each is applied to the upper electrode 21 and the susceptor 5 for the high-frequency power, pressure is 30 mTorr ,and gas flow rate (sccm) ratio is $C_5F_8:O_2:Ar =1:7/8:50$, so that the selection ratio of $SiO_2$ to SiN is grasped, where the selection ratio is the $SiO_2$ etching rate to the SiN shoulder portion etching rate when etching is carried out as shown A in FIG. 2B. The etching rate of the SiN shoulder portion is computed based on a portion B, where the scraping in the vertical direction is the maximum as shown enlarged in FIG. 2C.

The results indicate that the selection ratio is 24.4 in the embodiment and 7.2 in the comparison. Based on the result, keeping the applied high frequency to the range of the present invention has remarkably improved the selection ratio. The flow rate ratio $O_2/C_5F_8$ is preferably in the range of $5/8 \leq O_2/C_5F_8 \leq 7/8$ because this kind of high selection ratio is able to be obtained.

Next description will be made on the results of experiments carried out to grasp the effects of the present invention. In this case, $C_4F_8$ and Ar were used for the process gas and experiments were carried out under various process conditions. In addition, results of simulation partly carried out are also shown.

Figure 3:
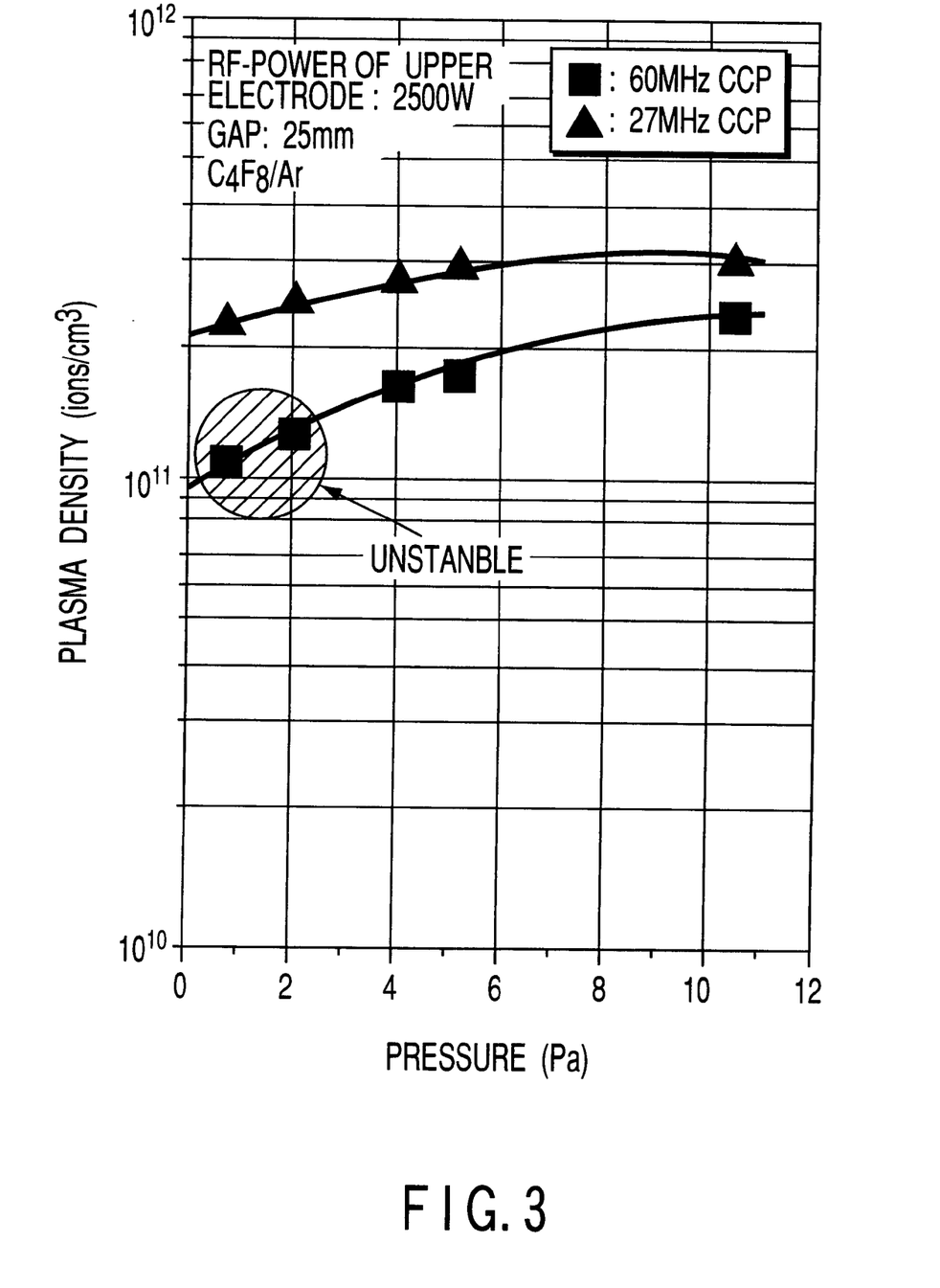
FIG. 3 is a graph showing the relationship between the chamber inner pressure and the plasma density when the high frequencies applied to the upper electrode are set to 27 MHz and 60 MHz and the chamber inner pressure is varied between 0.67 and 10.64 Pa.

First of all, the plasma density was measured by the use of the µwave interferometer with the gap between electrodes (process gap) set to 25 mm, the RF power of the upper electrode to 2500W and high frequencies applied to the upper electrode to 27 MHz and 60 MHz and with the pressure inside the chamber varied from 0.67 to 10.64 Pa. FIG. 3 shows the relationship between the chamber inside pressure and the plasma density in such a case. As shown in the figure, the higher plasma density is obtained in the case in which the high frequency applied to the upper electrode is brought to as high as 60 MHz than in the case in which the frequency is set to 27 MHz. In particular, it has been confirmed that in the low-pressure region of 2 Pa or lower, at 27 MHz, the plasma condition is unstable, whereas in the case of 60 MHz, sufficiently stable plasma is able to be obtained.

Figure 4:
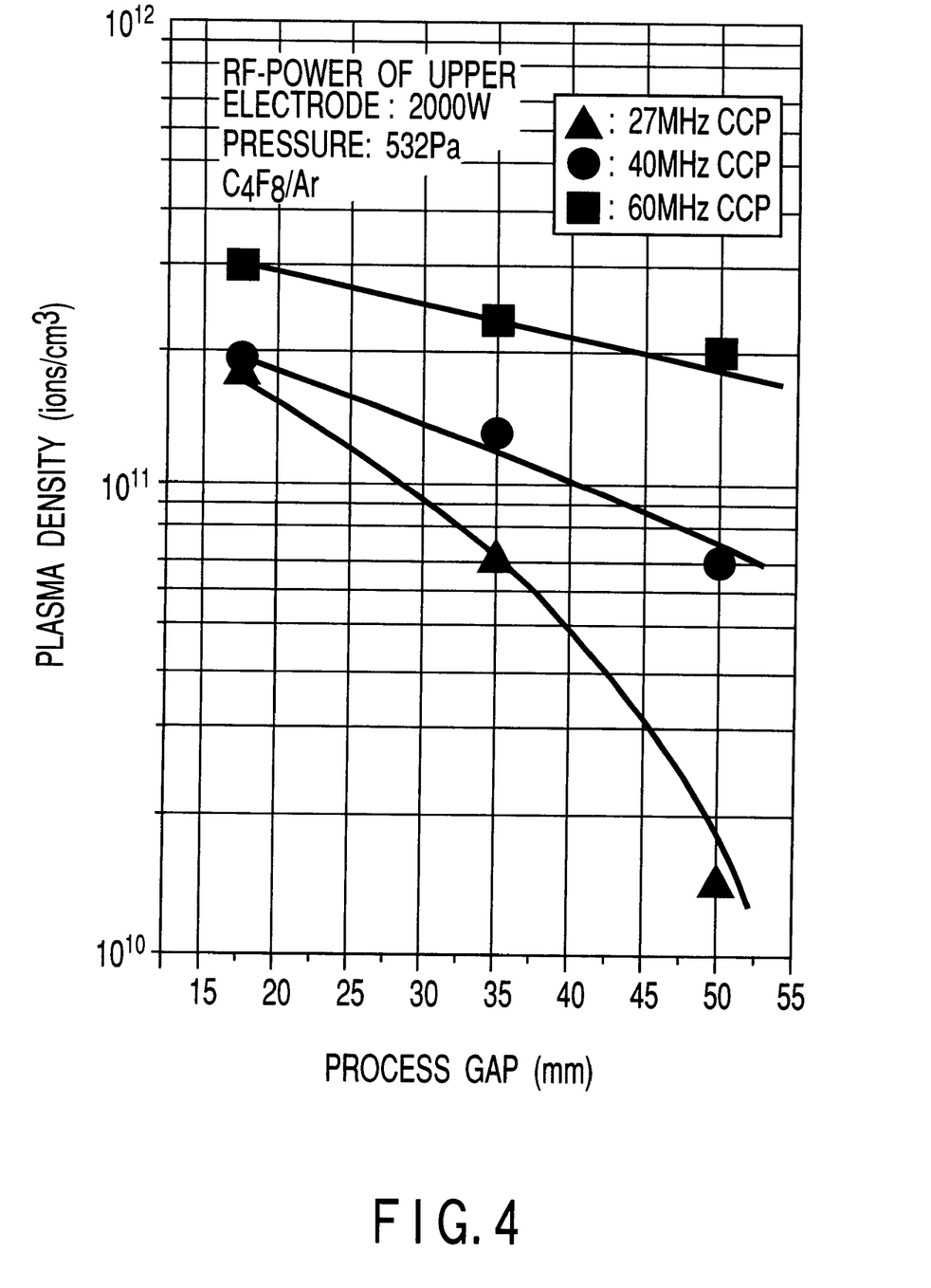
FIG. 4 is a graph showing the process gap and the plasma density when the high frequencies applied to the upper electrode are set to 27 MHZ, 40 MHZ, and 60 MHZ and the chamber inner pressure is set to 5.32 Pa.

The plasma densities were similarly measured with the RF power of the upper electrode set to 2000W, the high frequencies applied to the upper electrode to 27 MHz, 40 MHz, and 60 MHz, and the chamber inner pressure to 5.32 Pa and with the process gap varied from 17 to 50 mm. FIG. 4 shows the relationship between the process gap and the plasma density in such a case. As shown in this figure, the greater the high frequency applied to the upper electrode, the smaller the degree of plasma density drop associated with the increase in the process gap, and it has been confirmed that a wide range of process gaps are applicable if the frequency is 60 MHz.

Then, experiments were carried out on the dissociation of $C_4F_8$ which is the process gas when the high frequencies applied to the upper electrode are 27 MHz and 60 MHz. In this case, the electron energy distribution (EEDF) was estimated by the diluting gas adding method with the residence time set to specified conditions. As a result, it has been confirmed that the electron distribution in the 3 orange is 20 eV or less if there is scarcely a difference in EEDF according to the frequency and the distribution is assumed to be the Maxwell distribution. Since the dissociation of fluorocarbon-based gas such as $C_4F_8$ is entrusted to the multistage collision between plasma electrons and neutral particles in the plasma, and depends on the electron energy distribution and the residence time, based on the above results, the gas dissociation condition would scarcely change even if the high frequency applied to the electrode increases.

Figure 5:
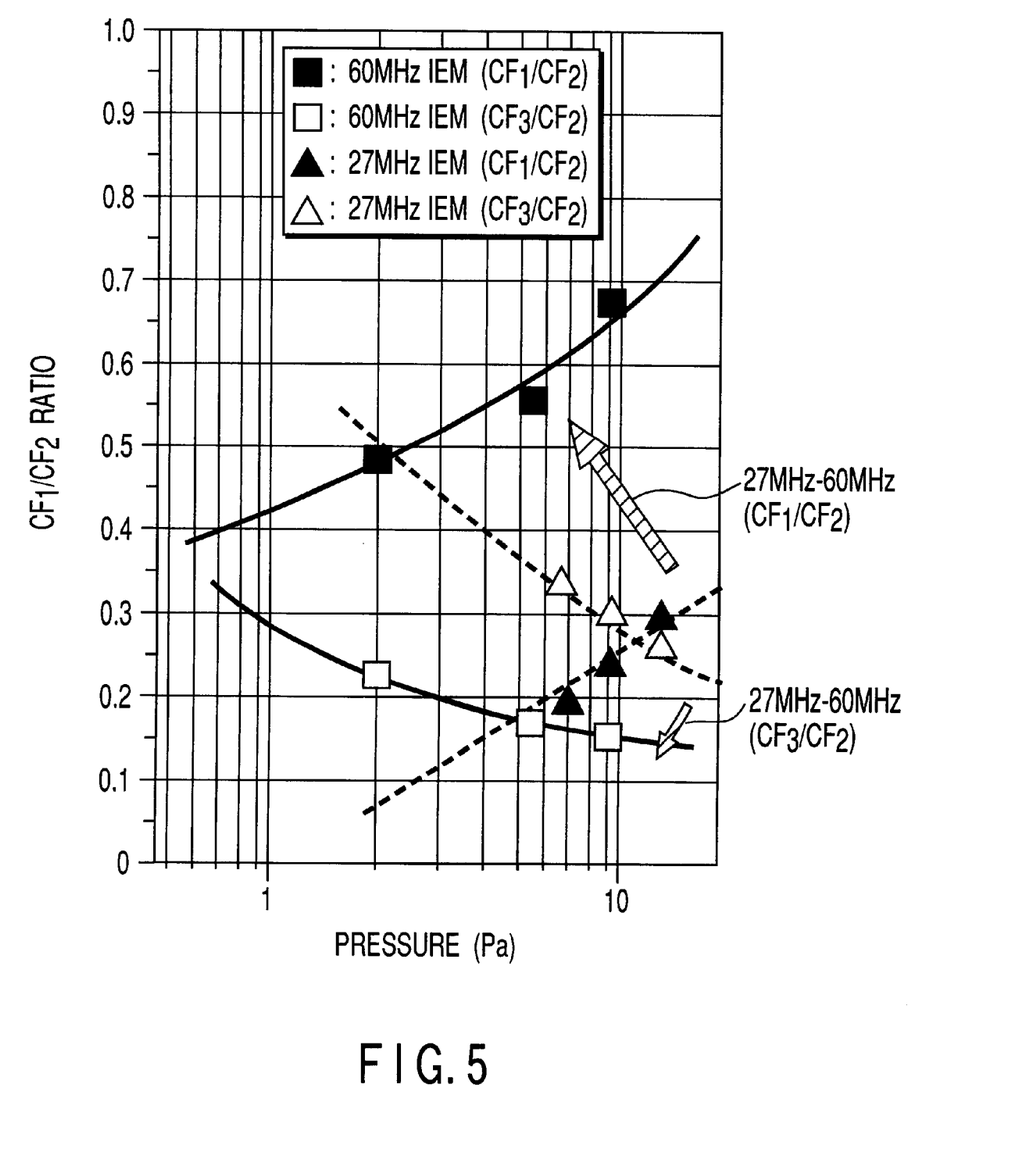
FIG. 5 is a graph showing the relationship between the chamber inner pressure and the $CF_x/CF_2$ ratio in the $C_4F_8$ and Ar plasma when the frequency applied to the upper electrode are 27 MHZ and 60 MHz, respectively.

On the other hand, by IRLAS (Infrared Diode Laser Absorption Spectroscopy), CF, $CF_2$, and $CF_3$ radicals were measured in the $C_4F_8$ and Ar plasma when the frequencies applied to the upper electrode are 27 MHz and 60 MHz. The results are shown in FIG. 5. As shown in this figure, as the frequency increases, CF tends to increase and $CF_3$ tends to decrease, indicating that dissociation takes place to a certain extent as the frequency increases, but the main radical species are all $CF_2$, and no significant change is observed in the gas dissociation condition, and the above-mentioned results have been confirmed.

Figure 6A:
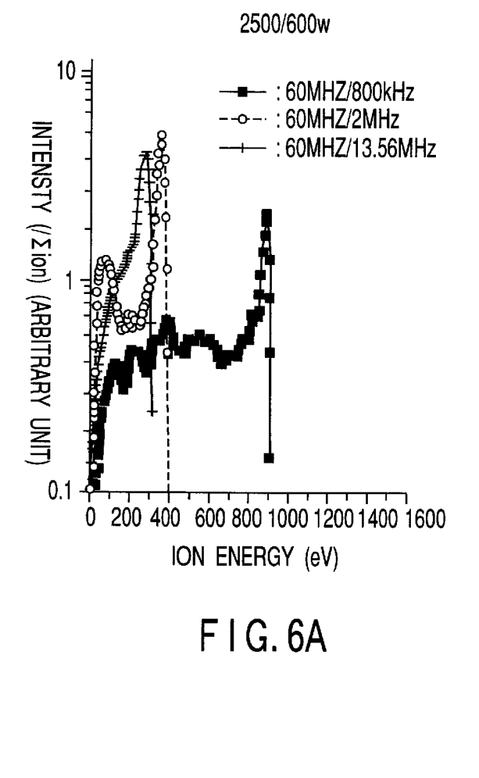
FIGS. 6A to 6C are graphs showing the IDEF simulation results when the high frequency applied to the lower electrode is varied to 800 kHz, 2 MHz, and 13.56 MHz and the power to 600W, 1000W, and 1500W.
Figure 6B:
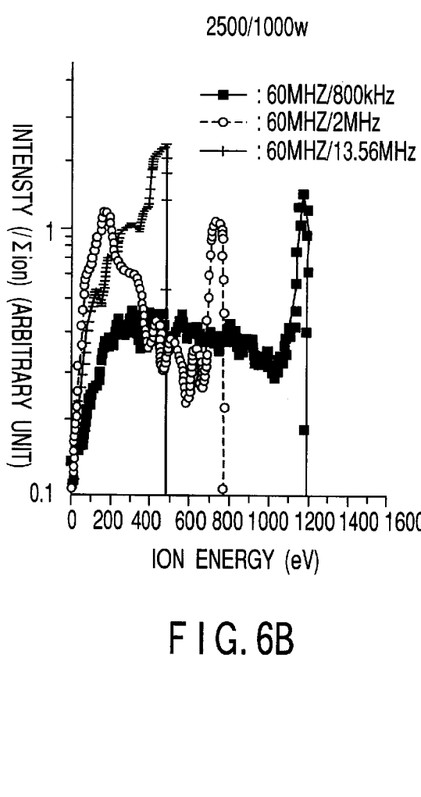
Figure 6C:
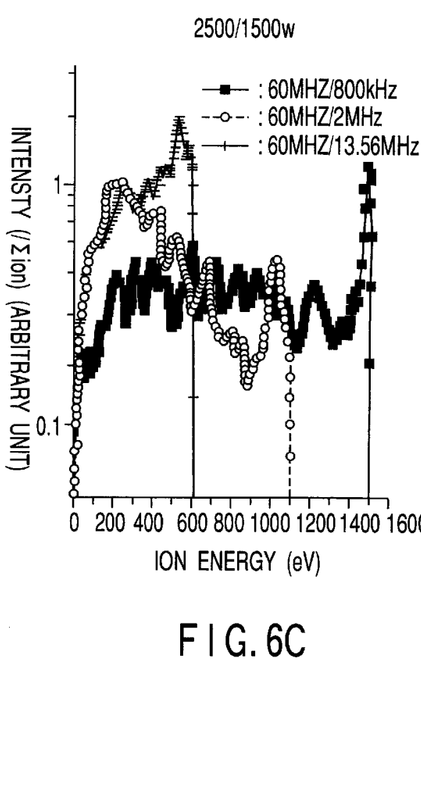

Then, by using the simulation (IES) of the ion energy distribution incident upon the wafer by the Ar ion, the peak value of IEDF (Ion Energy Distribution Function) was investigated when the chamber inner pressure is fixed to 2 Pa, the high frequency applied to the upper electrode to 60 MHz, and the power to 2500W and the high frequency applied to the lower electrode varied to 800 kHz, 2 MHz, and 13.56 MHz, and the powers to 600W, 1000W, and 1500W. The results are shown in FIGS. 6A to 6C. As shown in the figures, in the case of 2 MHz, the peak value is obtained at a suitable ion energy at all powers. Consequently, it has been confirmed that the appropriate ion assist is able to be obtained without causing damage to the wafer by applying 2 MHz to the lower electrode.

Figure 7A:
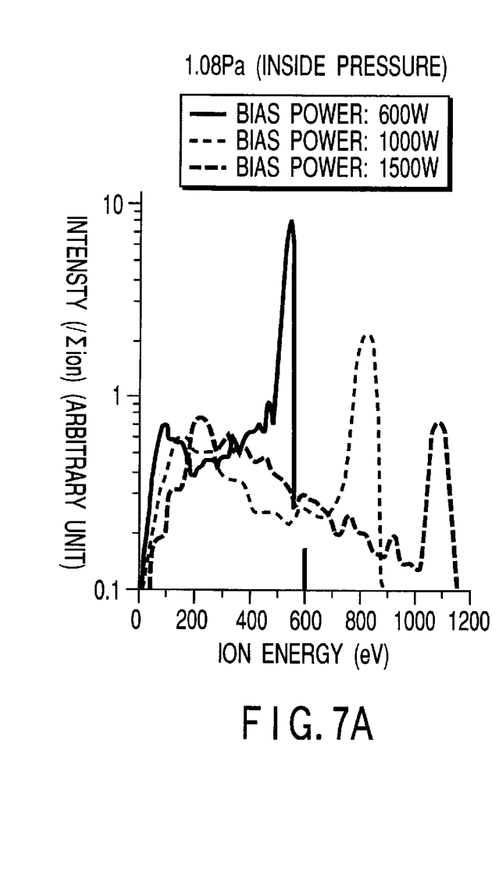
FIGS. 7A to 7C are graphs showing the IDEF simulation results when the high frequencies applied to the upper and the lower electrode are set to 60 MHz and 2 MHz, the chamber inner pressure is changed to 1.06 Pa, 2.00 Pa, and 5.32 Pa and the power applied to the lower electrode is changed to 600W, 1000W, and 1500W.
Figure 7B:
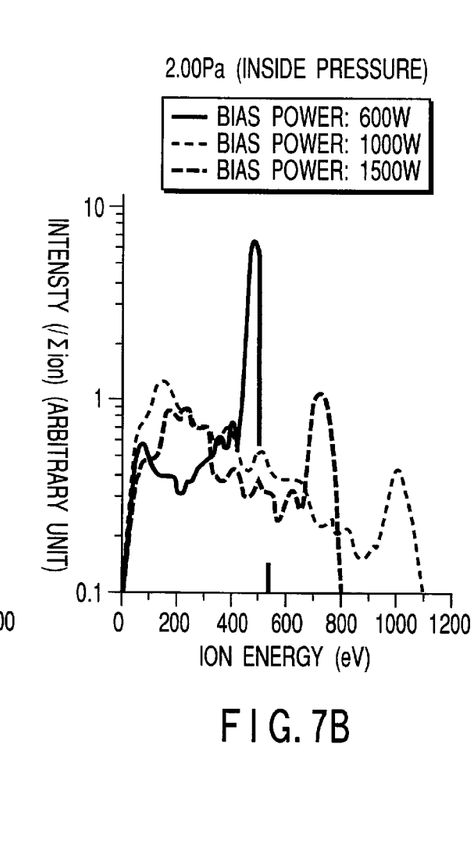
Figure 7C:
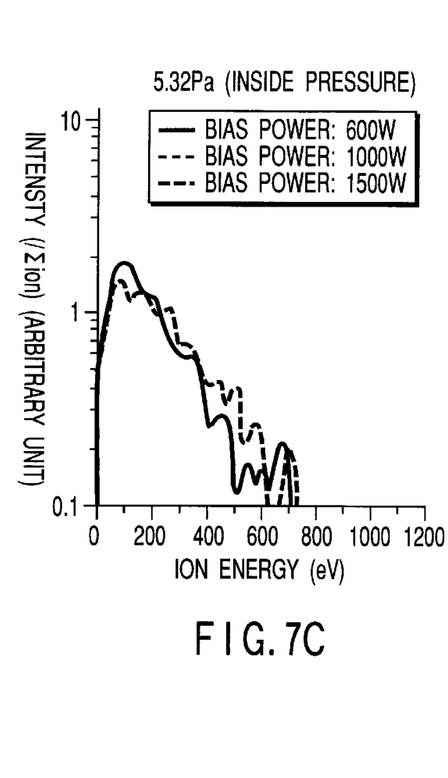

Next, in the similar manner, by using IES, with the high frequencies applied to the upper and the lower electrodes fixed to 60 MHz and 2 MHz, respectively, and the power to the upper electrode to 2500 W, and the chamber inner pressure varied to 1.06 Pa, 2.00 Pa, and 5.32 Pa, and the powers applied to the lower electrode to 600W, 1000W, and 1500W, the peak value of IEDF was investigated. FIGS. 7A to 7C show the results. As shown in the figures, at 5.32 Pa, ions scatter in the plasma sheath and IEDF does not change from the low bias RF power. That is, it is difficult to control IEDF. To the contrary, at 1.06 Pa and 2.00 Pa, it has been confirmed that the IEDF peak value is able to be controlled between 600 eV and 900 eV by changing the bias RF power applied to the lower electrode.

Figure 8A:
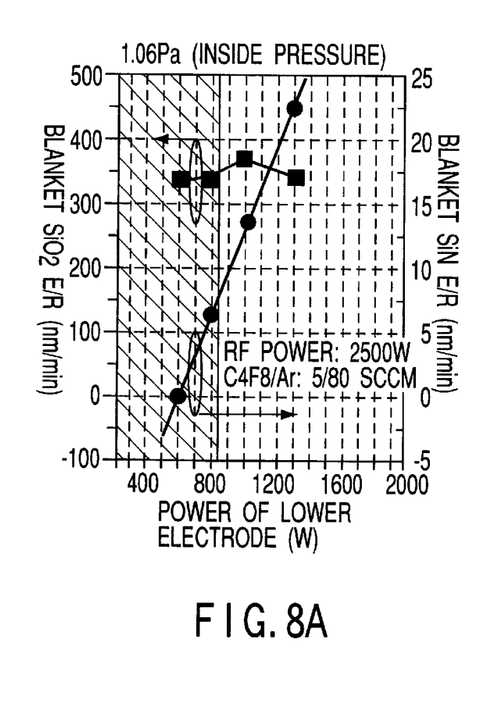
FIGS. 8A to 8C are graphs showing the etch rate of the blanket $SiO_2$ sample and blanket SiN sample when the high frequencies applied to the upper and the lower electrodes are set to 60 MHz and 2 MHz, and the power applied to the lower electrode is changed, while the chamber inner pressure is set to 1.06 Pa, 2.00 Pa, and 5.32 Pa.
Figure 8B:
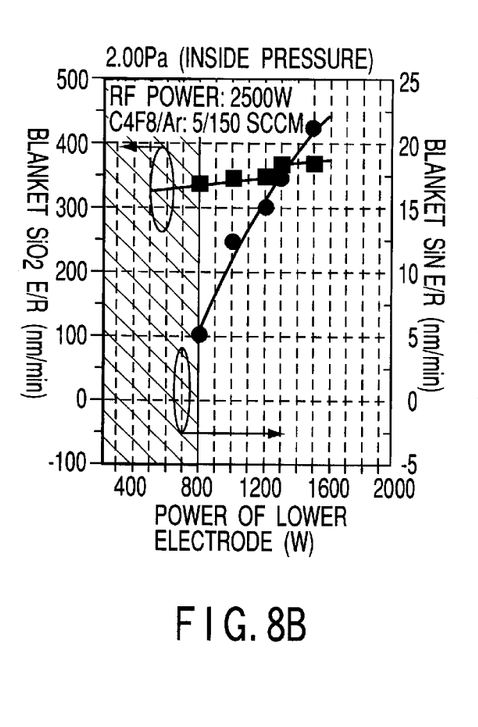
Figure 8C:
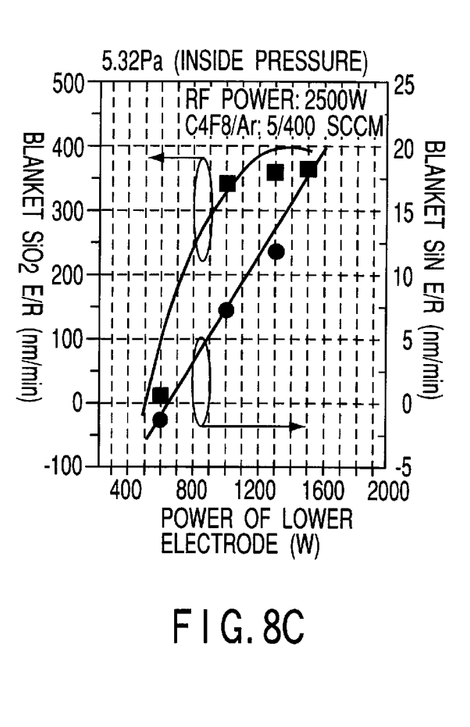

Next, by using a blanket $SiO_2$ sample and a blanket SiN sample, investigation was made on the etch rate with the chamber inner pressure varied to 1.06 Pa, 2.00 Pa, and 5.32 Pa, respectively, when the high frequencies applied to the upper and the lower electrodes are fixed to 60 MHz and 2 MHz, respectively and the power of the upper electrode to 2500 W and the power applied to the lower electrode varied. FIGS. 8A to 8C show the results. When $C_4F_8$ and Ar are used for the process gas, the etch rate of the $SiO_2$ film and SiN film increase proportionally to the RF bias and no high selection ratio is obtained at the chamber inner pressure of 5.32 Pa. To the contrary, it has been confirmed that the high selection ratio is able to be obtained on the low RF bias power side (shaded region in the figure) at lower-pressure sides 1.06 Pa and 2.00 Pa.

Figure 9:
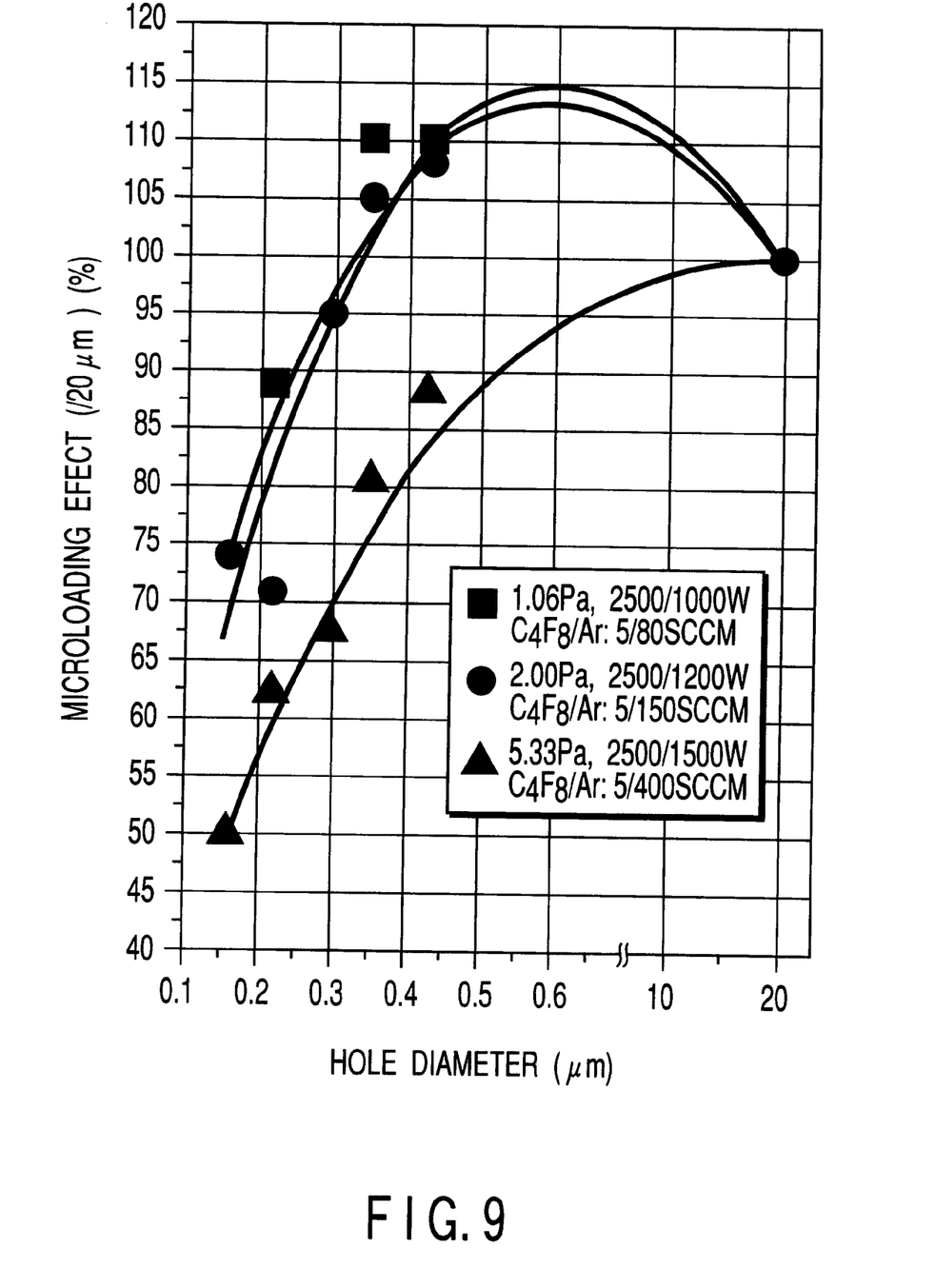
FIG. 9 is a graph showing the results of measuring microloading effects at the hole diameter varied from 20 μm to 0.15 μm in the combination of Rf power of the lower electrode with the chamber pressure in which the selection ratio at the self align contact becomes equivalent (>20) when the high frequency applied to the upper and the lower electrodes is set to 60 MHz and 2 MHz.

Then, the measurement was made on the microloading effects when the hole diameter is between 20 µm and 0.15 µm in the combinations of the lower electrode RF power with the chamber pressure where the selection ratio at the self align contact becomes equivalent (>20) when the high frequencies applied to the upper and the lower electrodes are set to 60 MHz and 2 MHz, respectively. FIG. 9 shows the results. In this case, the microloading effects are shown as the etching rate with the etching rate at the time of 20 µm hole diameter set to 100%. As shown in the figure, satisfactory results were obtained on the low pressure sides of 1.06 Pa and 2.00 Pa. That is, it has been confirmed that the holes as fine as 0.15 to 4 µm are able to be etched on the low-pressure side. It is assumed that the still finer etching holes of 1 µm would be able to be etched sufficiently.

Based on the above results, it has been confirmed that the fine machinability is compatible with the high selection ratio in the range specified in the present invention. In particular, it has been confirmed that still better effects are able to be achieved on the low pressure sides of 1.06 Pa and 2.00 Pa.

The present invention can be varied without being limited to the embodiments described above. For example, in the above embodiments, description was made on the cases in which semiconductor wafers are used for the to-be-treated substrates and etching is carried out thereon, but the to-be-treated substrates may be other substrates such as liquid crystal display (LCD) substrates, and plasma treatment is not limited to etching but may be sputtering, CVD, and other treatment methods.

As described above, according to the present invention, when the first and the second electrodes are provided opposite to each other in the chamber, the high-frequency electric field is formed between the first and the second electrodes to generate the process gas plasma, and plasma treatment, particularly, etching treatment is carried out on the to-be-treated substrate with that plasma, while the process gas is being introduced into the chamber held under the reduced pressure with the to-be-treated substrate supported by the second electrode, applying the high frequency of 50 to 150 MHz higher than the conventional to the first electrode enables the plasma density to increase without changing the plasma dissociation condition from that of the conventional suitable plasma and also enables the formation of suitable plasma under the still reduced pressure conditions, and consequently, it becomes possible to properly respond to further increased refinement of the design rule, and at the same time, applying the high frequency of 1 to 4 MHz higher than the conventional also to the second electrode enables the proper ion effects to be exerted to the to-be-treated substrate at reduced pressure, and in particular, in the case of etching, enables the anisotropic etching with still higher selectivity, and at the same time, reduces the damage to the to-be-treated substrate. In addition, by adopting the conditions of the present invention, it is possible to achieve plasma treatment, particularly, etching treatment, with wide margin of process conditions and remarkably high stability.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

What is claimed is:

1. An etching method for etching an $SiO_2$ film formed on an SiN film on a substrate with a plasma of a process gas which contains $C_4F_8$, said plasma formed by a high-frequency electric field applied between first and second electrodes while introducing the process gas into a chamber held to a reduced pressure with the first and the second electrodes mounted opposite to each other inside the chamber and with the substrate supported by the second electrode, comprising:

applying a first high frequency signal in a range from 50 to 150 MHz to the first electrode;

applying a second high frequency signal in a range from 1 to 4 MHz to the second electrode and at a power not greater than 800 W; and etching with a pressure of 1.06 to 2.00 Pa.

2. An etching method according to claim 1, wherein the first high frequency signal applied to the first electrode ranges from 50 to 80 MHz and the second high frequency signal applied to the second electrode ranges from 1 to 3 MHz.

3. An etching method according to claim 2, wherein the first high frequency signal applied to the first electrode is about 60 MHz and the high second frequency signal applied to the second electrode is about 2 MHz.

4. A plasma treatment method according to claim 1, wherein a hole is formed in the $SiO_2$ film by etching, the hole diameter being 0.1 to 0.4 $\mu$m.

5. A plasma treatment method according to claim 4, wherein the hole diameter is 0.15 to 0.4 $\mu$m.

* * * * *